(12) United States Patent
Um et al.

(10) Patent No.: US 10,580,847 B2
(45) Date of Patent: Mar. 3, 2020

(54) DISPLAY DEVICE

(71) Applicant: LG Display Co., Ltd., Seoul (KR)

(72) Inventors: Hyunchul Um, Paju-si (KR); JinHwan Kim, Paju-si (KR); YeongHo Yun, Gumi-si (KR); JunHo Yeo, Chilgok-gun (KR); JeongMin Bae, Daegu (KR); Seokhwan Choi, Gwangju (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/019,379

(22) Filed: Jun. 26, 2018

(65) Prior Publication Data

US 2019/0035872 A1    Jan. 31, 2019

(30) Foreign Application Priority Data

Jul. 27, 2017 (KR) ........................ 10-2017-0095485

(51) Int. Cl.
*H01L 27/32* (2006.01)
*H01L 51/52* (2006.01)
*G09G 3/3225* (2016.01)
*H01L 51/00* (2006.01)

(52) U.S. Cl.
CPC ...... *H01L 27/3276* (2013.01); *H01L 27/3246* (2013.01); *H01L 27/3248* (2013.01); *H01L 27/3258* (2013.01); *H01L 51/5212* (2013.01); *H01L 51/5253* (2013.01); *H01L 51/5265* (2013.01); *G09G 3/3225* (2013.01); *H01L 51/0097* (2013.01); *H01L 2251/5338* (2013.01)

(58) Field of Classification Search
CPC ............. H01L 27/3276; H01L 27/3258; H01L 27/3248; H01L 27/3246; H01L 2924/12044; H01L 2227/32; H01L 51/5265; H01L 51/5212; H01L 51/5253; H01L 51/0097; H01L 51/50
See application file for complete search history.

(56) References Cited

U.S. PATENT DOCUMENTS

| | | | |
|---|---|---|---|
| 2014/0217397 A1* | 8/2014 | Kwak | H01L 27/1218 257/43 |
| 2016/0066409 A1 | 3/2016 | Kwon et al. | |
| 2016/0270209 A1* | 9/2016 | Cho | G06F 1/1652 |
| 2017/0194404 A1* | 7/2017 | Park | H01L 27/3262 |
| 2018/0145125 A1* | 5/2018 | Lee | H01L 27/3262 |

FOREIGN PATENT DOCUMENTS

KR    10-2017-0046683 A    5/2017

* cited by examiner

*Primary Examiner* — Galina G Yushina
(74) *Attorney, Agent, or Firm* — Seed IP Law Group LLP

(57) ABSTRACT

A display device is disclosed, which may increase the number of lines arranged in a bending area and at the same time may minimize a crack generated in the bending area. The display device comprises a display area in which pixels are arranged, and a non-display area surrounding the display area, provided with a bending area within the non-display area; a plurality of first lines arranged in the bending area and electrically connected with the pixels; a first organic film arranged on the first lines; a plurality of second lines arranged on the first organic film in the bending area and electrically connected with the pixels; and a second organic film arranged on the second lines, wherein at least one of the first organic film and the second organic film is provided with an open area.

14 Claims, 7 Drawing Sheets

DISPLAY DEVICE

CROSS REFERENCE TO RELATED APPLICATIONS

This application claims the benefit of the Korean Patent Application No. 10-2017-0095485 filed on Jul. 27, 2017, which is hereby incorporated by reference for all purposes as if fully set forth herein.

BACKGROUND

Technical Field

The present disclosure relates to a display device that includes a bending area.

Description of the Related Art

With the advancement of the information age, a demand for a display device for displaying an image has been increased in various forms. Therefore, various display devices such as liquid crystal display (LCD) devices, non-self-light emitting display devices such as plasma display panel (PDP) devices, organic light emitting display (OLED) devices and electroluminescence display devices such as quantum dot light emitting display (QLED) devices have been used.

Among the display devices, the organic light emitting display device and the quantum dot light emitting display device are self-light emitting devices, and have advantages in that a viewing angle and a contrast ratio are more excellent than those of the liquid crystal display (LCD) device. Also, since the organic light emitting display device and the quantum dot light emitting display device do not require a separate backlight, it is advantageous that the light emitting display devices are able to be thin and lightweight and have low power consumption. Furthermore, the organic light emitting display device has advantages in that it may be driven at a low direct current voltage, has a fast response speed, and especially has a low manufacturing cost.

Recently, studies and development for realizing the organic light emitting display device of the display devices as a flexible display device are ongoing. In the flexible display device, a pixel array layer that includes thin film transistors and lines is formed on a flexible substrate. Since the flexible display device is able to display an image even though it is bent like a paper, the flexible display device may be used for various fields.

A bezel bending technique for minimizing a width of a bezel by bending an area corresponding to a bezel, in which an image is not realized, may be applied to the flexible display device. At this time, a plurality of lines arranged in the bezel generate a stress, whereby a crack may be generated by the stress. If the crack is generated in the plurality of lines, signal transmission is not performed normally, whereby a defect occurs in the flexible display device.

Meanwhile, as the display device requires high resolution, the number of lines is increased, whereas a bezel area is reduced to realize a narrow bezel. At this time, the display device has a drawback in arranging a lot of lines in a narrow bezel area.

BRIEF SUMMARY

Accordingly, the present disclosure is directed to a display device that substantially obviates one or more problems due to limitations and disadvantages of the related art.

An advantage of the present disclosure is to provide a display device that may minimize a crack generated in lines arranged in a bending area.

Another advantage of the present disclosure is to provide a display device that may minimize a crack generated in an organic film arranged in a bending area.

Still another advantage of the present disclosure is to provide a display device that may prevent a crack generated in an organic film arranged in a bending area from being propagated.

Further still another advantage of the present disclosure is to provide a display device that may increase the number of lines arranged in a bending area.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device according to one embodiment of the present disclosure comprises a display area in which pixels are arranged, a non-display area surrounding the display area, and a bending area within the non-display area; a plurality of first lines arranged in the bending area and electrically connected with the pixels; a first organic film arranged on the first lines; a plurality of second lines arranged on the first organic film in the bending area and electrically connected with the pixels; and a second organic film arranged on the second lines, wherein at least one of the first organic film and the second organic film is provided with an open area.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
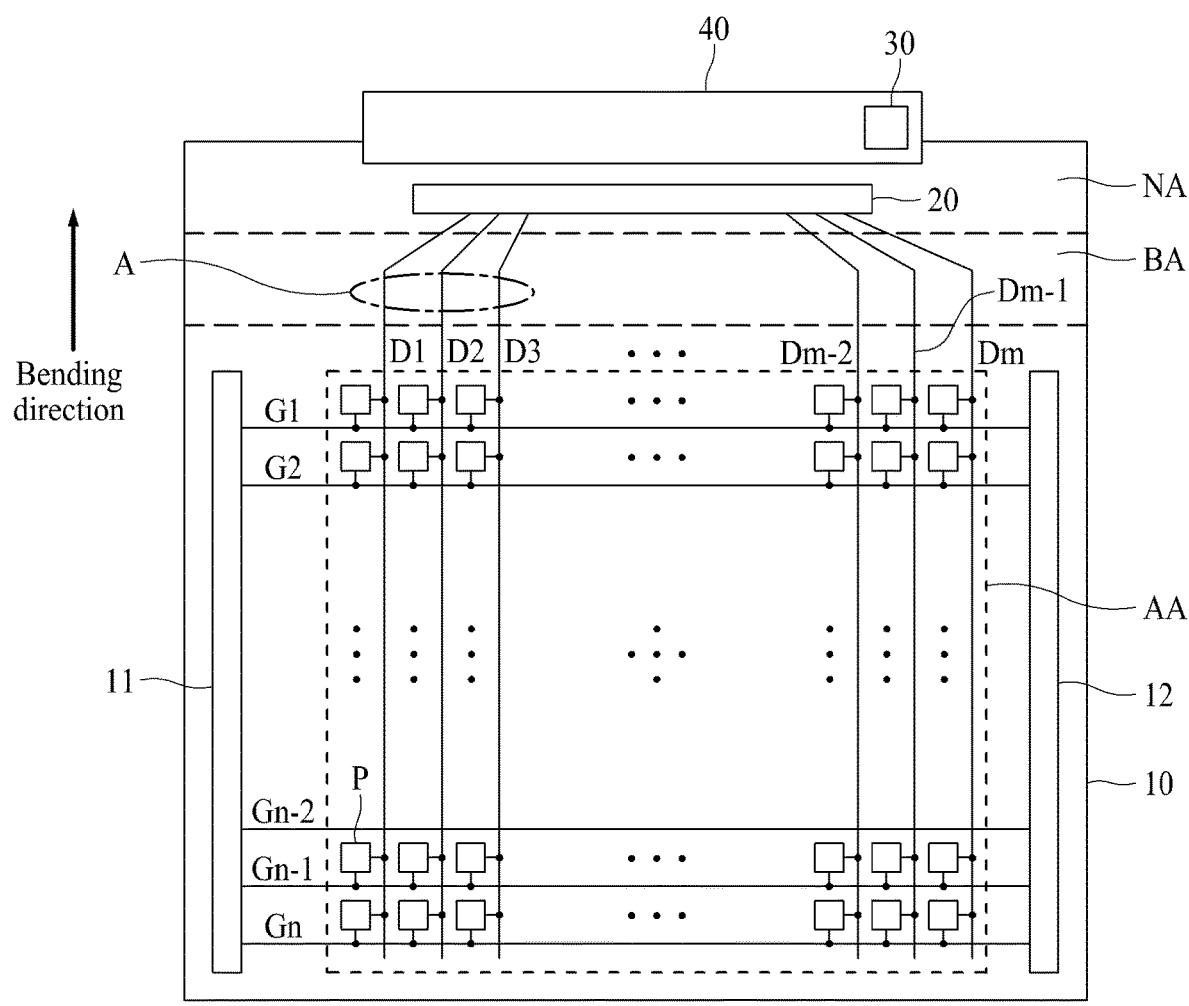
FIG. 1 is a view briefly illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

In describing a time relationship, for example, when the temporal order is described as 'after~,' 'subsequent~,' 'next~,' and 'before~,' a case which is not continuous may be included unless 'just' or 'direct' is used.

It will be understood that, although the terms "first," "second," etc. may be used herein to describe various elements, these elements should not be limited by these terms. These terms are only used to distinguish one element from another element. For example, a first element could be termed a second element, and, similarly, a second element could be termed a first element, without departing from the scope of the present disclosure.

"X-axis direction," "Y-axis direction" and "Z-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the preferred embodiments of the present disclosure will be described in detail with reference to the accompanying drawings.

FIG. 1 is a view briefly illustrating a display device according to one embodiment of the present disclosure.

The display device according to the embodiment of the present disclosure may be realized as any one of a liquid crystal display, an organic light emitting display, an electroluminescence display, a quantum dot light emitting display device, and an electrophoresis display device. Hereinafter, the display device according to the embodiment of the present disclosure is realized as, but not limited to, an organic light emitting display device.

The display device according to one embodiment of the present disclosure includes a display panel 10, a first gate driver 11, a second gate driver 12, an integrated driver 20, a power supply 30, and a flexible circuit board 40. The integrated driver 20 includes a data driver, a level shifter and a timing controller.

Figure 2:
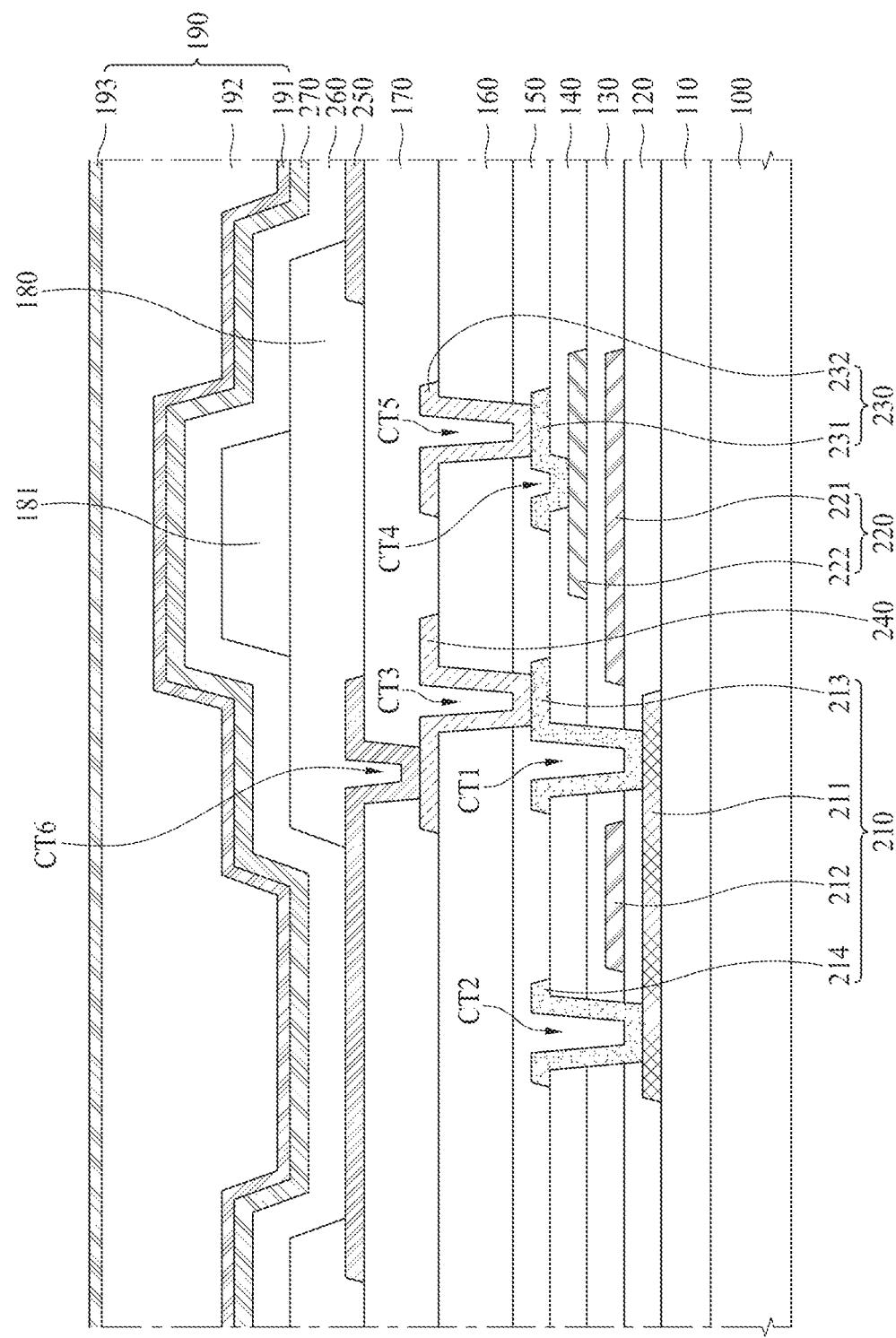
FIG. 2 is a cross-sectional view illustrating pixels of FIG. 1.

The display panel 10 may be categorized into a display area AA provided with pixels P to display an image and a non-display area NA for not displaying an image. A bending area BA may be included in the non-display area NA. On the display area AA, data lines D1 to Dm (m is a positive integer of 2 or more), gate lines G1 to Gn (n is a positive integer of 2 or more), and pixels P are formed. The data lines D1 to Dm are formed to cross the gate lines G1 to Gn. The pixels P may be connected to any one of the data lines D1 to Dm and any one of the gate lines G1 to Gn. The pixels P may be realized as an organic light emitting diode that includes an anode electrode, a light emitting layer, and a cathode electrode as shown in FIG. 2, thereby emitting light. On the non-display area NA, the first gate driver 11, the second gate drivers 12 and the integrated driver 20 are formed.

The first and second gate drivers 11 and 12 are connected to the gate lines G1 to Gn and supply gate signals. In more detail, the first and second gate drivers 11 and 12 receive clock signals and gate control signals including a start voltage from the level shifter. The first and second gate drivers 11 and 12 generate gate signals in accordance with the start voltage and clock signals and output the generated signals to the gate lines G1 to Gn.

The first and second gate drivers 11 and 12 may be formed in the non-display area NA in a gate driver in panel mode. For example, as shown in FIG. 1, the first gate driver 11 may be formed on the non-display area NA outside one side of the display area AA, and the second gate driver 12 may be formed on the non-display area NA outside the other side of the display area AA. Meanwhile, any one of the first and second gate drivers 11 and 12 may be omitted. In this case, one gate driver may be formed on the non-display area NA outside at one side of the display area AA.

The data driver is connected to the data lines D1 to Dm. The data driver receives digital video data and a data control signal from the timing controller. The data driver converts the digital video data to analog data voltages in accordance with the data control signal. The data driver supplies the analog data voltages to the data lines D1 to Dm.

The timing controller receives the digital video data and timing signals from an external system board. The timing signals may include a vertical synchronization signal, a horizontal synchronization signal, and a data enable signal.

The timing controller generates a gate control signal for controlling operation timing of the first and second gate drivers 11 and 12 and a data control signal for controlling operation timing of the data driver on the basis of the timing signals.

The data driver, the level shifter, and the timing controller may be formed as one integrated circuit (IC) like the integrated driver 20 of FIG. 1. However, the embodiment of the present disclosure is not limited to this case, and each of the data driver, the level shifter, and the timing controller may be formed as a separate driving IC. The integrated driver 20 may directly be attached onto the lower substrate of the display panel 10 in a chip on glass (COG) mode or a chip on plastic (COP) mode.

The power supply 30 generates a plurality of power voltages used to drive the pixels P, such as VDD voltage and VSS voltage, gate driving voltages used to drive the first and second gate drivers 11 and 12, such as a gate on voltage Von and a gate off voltage Voff, a source driving voltage used to drive the data driver, and a control driving voltage used to drive the timing controller. The power supply 30 may be packaged in the flexible circuit board 40 as shown in FIG. 1. The flexible circuit board 40 may be a flexible printed circuit board.

FIG. 2 is a cross-sectional view illustrating pixels of FIG. 1.

In FIG. 2, the pixels P include an organic light emitting diode having an anode electrode 250, a light emitting layer 260 and a cathode electrode 270.

Referring to FIG. 2, a buffer film 110 is formed on one surface of the lower substrate 100. The lower substrate 100 may be, but not limited to, a plastic film or glass substrate. The buffer film 110 may be formed on one surface of the lower substrate 100 to protect thin film transistors 210 and light emitting diodes from water permeated through the lower substrate 100 which is vulnerable to moisture permeability. The buffer film 110 may be made of a plurality of inorganic films which are deposited alternately. For example, the buffer film 110 may be formed of a multi-layered film of one or more inorganic films of a silicon oxide film (SiOx), a silicon nitride film (SiNx), SiON and $SiO_2$, which are deposited alternately. The buffer film 110 may be omitted.

The thin film transistor 210, a capacitor 220 and a high potential voltage line 230 are formed on the buffer film 110.

The thin film transistor 210 includes an active layer 211, a gate electrode 212, a source electrode 213, and a drain electrode 214. Although the thin film transistor 210 is formed in a top gate mode in which the gate electrode 212 is arranged above the active layer 211 as shown in FIG. 2, it is to be understood that the thin film transistor of the present disclosure is not limited to the top gate mode. That is, the thin film transistor 210 may be formed in a bottom gate mode in which the gate electrode 212 is arranged below the active layer 211 or a double gate mode in which the gate electrode 212 is arranged above and below the active layer 211.

The capacitor 220 includes a first capacitor electrode 221 and a second capacitor 222. The high potential voltage line 230 includes first and second high potential voltage lines 231 and 232.

In detail, the active layer 211 is formed on the buffer film 110. The active layer 211 may be formed of a silicon based semiconductor material or an oxide based semiconductor material. A light-shielding layer and insulating film for shielding external light entering the active layer 211 may be formed between the buffer film 110 and the active layer 211.

A gate insulating film 120 may be formed on the active layer 211. The gate insulating film 220 may be formed of an inorganic film, for example, a silicon oxide film (SiOx), a silicon nitride film (SiNx) or a multi-layered film of the silicon oxide film and the silicon nitride film.

The gate electrode 212, the first capacitor electrode 221 and the gate line may be formed on the gate insulating film 120. The first capacitor electrode 221 may be extended from the gate electrode 212. The gate electrode 212, the first capacitor electrode 221 and the gate line may be formed of a single layer or multi-layer comprised of any one of Mo, Al, Cr, Au, Ti, Ni, Nd and Cu or their alloy.

A first inter-layer dielectric film 130 may be formed on the gate electrode 212, the first capacitor electrode 221 and the gate line. The first inter-layer dielectric film 130 may be formed of an inorganic film, for example, a silicon oxide film (SiOx), a silicon nitride film (SiNx), or a multi-layered film of the silicon oxide film and the silicon nitride film.

The second capacitor electrode 222 may be formed on the first inter-layer dielectric film 130. The second capacitor electrode 222 may be formed of a single layer or multi-layer comprised of any one of Mo, Al, Cr, Au, Ti, Ni, Nd and Cu or their alloy.

A second inter-layer dielectric film 140 may be formed on the second capacitor electrode 222. The second inter-layer dielectric film 140 may be formed of an inorganic film, for example, a silicon oxide film (SiOx), a silicon nitride film (SiNx), or a multi-layered film of the silicon oxide film and the silicon nitride film.

The source electrode 213, the drain electrode 214, the first high potential voltage line 231 and the date line may be formed on the second inter-layer dielectric film 140. The source electrode 213 may be connected to the active layer 211 through a first contact hole CT1 that passes through the gate insulating film 120 and the first and second inter-layer dielectric films 130 and 140. The drain electrode 214 may be connected to the active layer 211 through a second contact hole CT2 that passes through the gate insulating film 120 and the first and second inter-layer dielectric films 130 and 140. The first high potential voltage line 231 may be connected to the second capacitor electrode 222 through a fourth contact hole CT4 that passes through the second inter-layer insulating film 140. Each of the source electrode 213, the drain electrode 214, the first high potential voltage line 231 and the data line may be formed of a single layer or multi-layer comprised of any one of Mo, Al, Cr, Au, Ti, Ni, Nd and Cu or their alloy.

A passivation film 150 for insulating the thin film transistor 210 may be formed on the source electrode 213, the drain electrode 214, the first high potential voltage line 231 and the data line. The passivation film 150 may be formed of an inorganic film, for example, a silicon oxide film (SiOx), a silicon nitride film (SiNx), or a multi-layered film of the silicon oxide film and the silicon nitride film.

A first planarization film 160 for planarizing a step difference due to the thin film transistor 210 may be formed on the passivation layer 150. The first planarization film 160 may be formed of an organic film such as acrylic resin, epoxy resin, phenolic resin, polyamide resin, and polyimide resin.

An anode auxiliary electrode 240 and the second high potential voltage line 232 may be formed on the first planarization film 160. The anode auxiliary electrode 240 may be connected to the source electrode 213 through a third contact hole CT3 that passes through the passivation film 150 and the first planarization film 160. The second high potential voltage line 232 may be connected to the first high potential voltage line 231 through a fifth contact hole CT5 that passes through the passivation film 150 and the first planarization film 160. Each of the anode auxiliary electrode 240 and the second high potential voltage line 232 may be formed of a single layer or multi-layer comprised of any one of Mo, Al, Cr, Au, Ti, Ni, Nd and Cu or their alloy. The anode auxiliary electrode 240 and the second high potential voltage line 232 may be omitted.

A second planarization film 170 may be formed on the anode auxiliary electrode 240 and the second high potential voltage line 232. The second planarization film 170 may be formed of an organic film such as acrylic resin, epoxy resin, phenolic resin, polyamide resin, and polyimide resin. If the anode auxiliary electrode 240 and the second high potential voltage line 232 are omitted, the second planarization film 170 may be omitted.

A light emitting diode, a bank 180, and a spacer 181 are formed on the second planarization film 170. The light emitting diode includes an anode electrode 250, a light emitting layer 260, and a cathode electrode 270.

The anode electrode 250 may be formed on the second planarization film 170. The anode electrode 250 may be connected to the anode auxiliary electrode 240 through a sixth contact hole CT6 that passes through the second planarization film 170. The anode electrode 250 may be formed of Al, Ag, Mo, a deposition structure of Mo and Ti (Mo/Ti), Cu, a deposition structure (Ti/Al/Ti) of Al and Ti, a deposition structure (ITO/Al/ITO) of Al and ITO, an APC alloy, or a deposition structure (ITO/APC/ITO) of APC alloy and ITO. The APC alloy is an alloy of Ag, Pd and Cu.

The bank 180 may be formed to cover an edge of the anode electrode 250, whereby a light emitting area of the pixels P may be defined by the bank 180. The light emitting area of the pixels P indicates an area where the anode electrode 250, the light emitting layer 260 and the cathode electrode 270 are sequentially deposited and thus holes from the anode electrode 250 are combined with electrons from the cathode electrode 270 in the light emitting layer 260 to emit light. In this case, since the area where the bank 180 is formed does not emit light, this area may be defined as a non-emission area. The bank 180 may be formed of an organic film such as acrylic resin, epoxy resin, phenolic resin, polyamide resin, and polyimide resin. The spacer 181 may be formed on the bank 180. The spacer 181 may be formed of an organic film such as acrylic resin, epoxy resin, phenolic resin, polyamide resin, and polyimide resin. The spacer 181 may be omitted.

The light emitting layer 260 may be formed on the anode electrode 250, the bank 180 and the spacer 181. The light emitting layer 260 is a common layer commonly formed on the pixels P, and may be a white light emitting layer for emitting white light. In this case, the light emitting layer 260 may be formed in a tandem structure of two stacks or more. Each of the stacks may include a hole transporting layer, at least one light emitting layer, and an electron transporting layer. Also, a charge generating layer may be formed between the stacks.

The hole transporting layer serves to actively deliver holes injected from the anode electrode 250 or the charge generating layer to the light emitting layer. The light emitting layer may be formed of an organic material that includes phosphor or fluorescent material, whereby predetermined light may be emitted. The electron transporting layer serves to actively deliver electrons injected from the cathode electrode 270 or the charge generating layer to the light emitting layer.

The charge generating layer may include an n type charge generating layer arranged to adjoin the lower stack, and a p type charge generating layer formed on the n type charge generating layer and arranged to adjoin the upper stack. The n type charge generating layer injects electrons into the lower stack, and the p type charge generating layer injects holes into the upper stack. The n type charge generating layer may be an organic layer of an organic host material doped with alkali metal such as Li, Na, K or Cs, or alkali earth metal such as Mg, Sr, Ba or Ra, wherein the organic host material has electron transporting capability. The p type charge generating layer may be an organic layer of an organic host material doped with a dopant, wherein the organic host material has hole transportation capability.

Although the light emitting layer 260 is a common layer commonly formed in the pixels P and is a white light emitting layer for emitting white light in FIG. 2, the embodiment of the present disclosure is not limited to the example of FIG. 2. That is, the light emitting layer 260 may be formed in each of the pixels P. In this case, the pixels P may include a red pixel including a red light emitting layer for emitting red light, a green pixel including a green light emitting layer for emitting green light, and a blue pixel including a blue light emitting layer for emitting blue light.

The cathode electrode 270 is formed on the light emitting layer 260. The cathode electrode 270 is a common layer commonly formed in the pixels P. The cathode electrode 270 may be formed of a transparent conductive material (TCO) such as ITO and IZO, which may transmit light, or a semi-transmissive conductive material such as Mg, Ag, and alloy of Mg and Ag. If the cathode electrode 270 is formed of a semi-transmissive conductive material, light-emission efficiency may be enhanced by micro cavity. A capping layer may be formed on the cathode electrode 270.

An encapsulation film 190 is formed on the cathode electrode 270. The encapsulation film 190 serves to prevent oxygen or water from being permeated into the light emitting layer 260 and the cathode electrode 270. The encapsulation film 190 may include at least one inorganic film and at least one organic film.

For example, the encapsulation film 190 may include a first inorganic film 191, an organic film 192, and a second inorganic film 193. In this case, the first inorganic film 191 is formed to cover the cathode electrode 270. The organic film 192 is formed on the first inorganic film 191. Preferably, the first organic film 192 is formed with a sufficient thickness to prevent particles from being permeated into the light emitting layer 260 and the cathode electrode 270 by passing through the first inorganic film 191. The second inorganic film 192 is formed to cover the organic film 192.

Each of the first and second inorganic films 191 and 193 may be formed of a silicon nitride, an aluminum nitride, a zirconium nitride, a titanium nitride, a hafnium nitride, a tantalum nitride, silicon oxide, an aluminum oxide, or a titanium oxide.

The organic film 192 may be formed transparently to transmit light emitted from the light emitting layer 260. The organic film 192 may be formed of an organic material, which may transmit light emitted from the light emitting layer 192 at 99% or more, for example, acrylic resin, epoxy resin, phenolic resin, polyamide resin, or polyimide resin.

Color filters and a black matrix may be formed on the upper substrate, and the upper substrate and the lower substrate may be bonded to each other by an adhesive layer.

In this case, the color filters may be arranged to correspond to an emission area of the pixel P, and the black matrix may be arranged between the color filters to correspond to the bank 180. The adhesive layer may be a transparent adhesive film or a transparent adhesive resin. The upper substrate may be a plastic film, a glass substrate, or an encapsulation film (passivation film).

Referring to FIG. 1 again, a plurality of lines are formed in the bending area BA of the display panel 10. The bending area BA of the display panel 10 will be described in more detail together with various embodiments.

Figure 3:
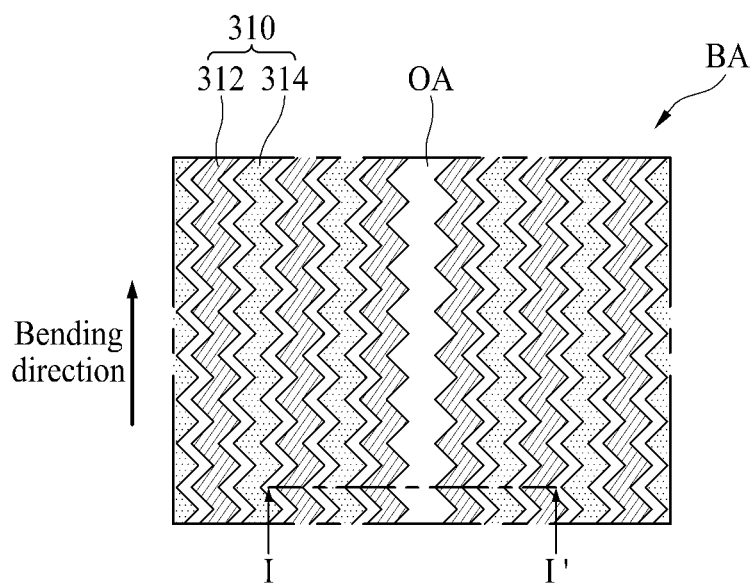
FIG. 3 is a plane view illustrating a first embodiment of a bending area of FIG. 1.
Figure 4:
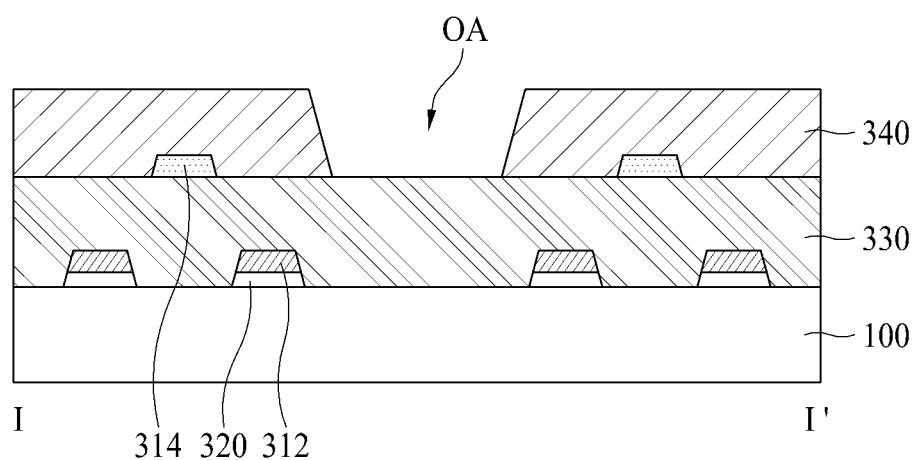
FIG. 4 is a cross-sectional view illustrating a first example taken along line I-I' of FIG. 3.
Figure 5:
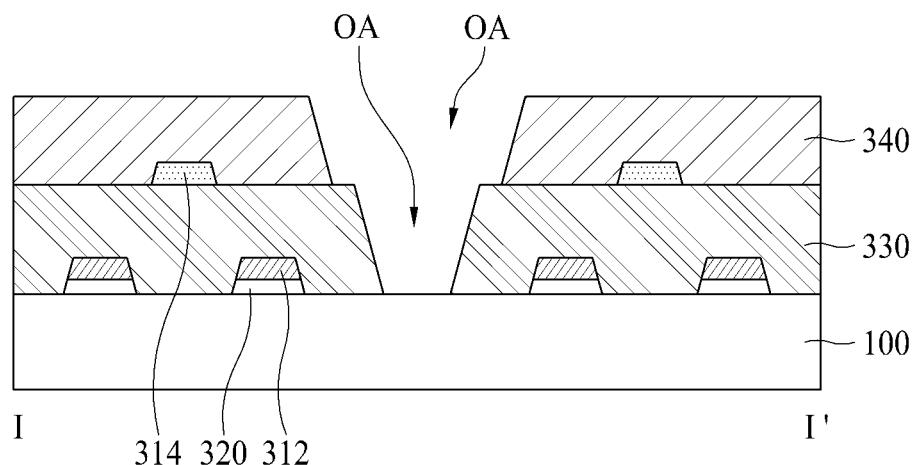
FIG. 5 is a cross-sectional view illustrating a second example taken along line I-I' of FIG. 3.
Figure 6:
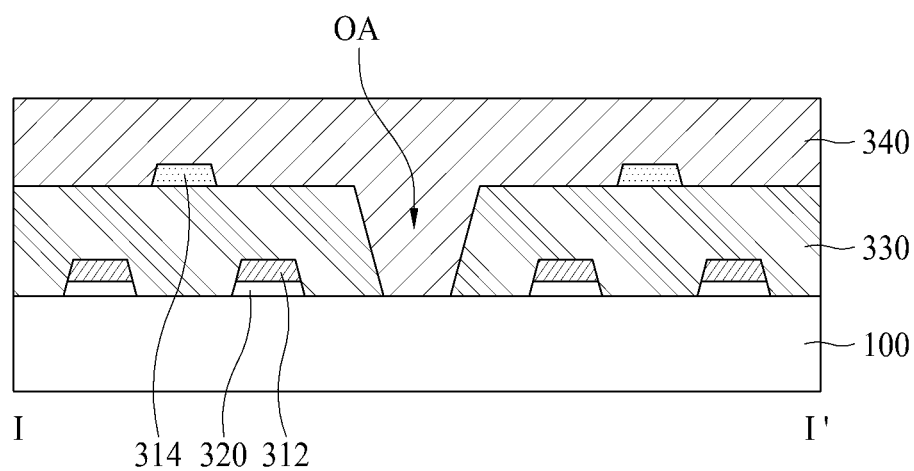
FIG. 6 is a cross-sectional view illustrating a third example taken along line I-I' of FIG. 3.
Figure 7:
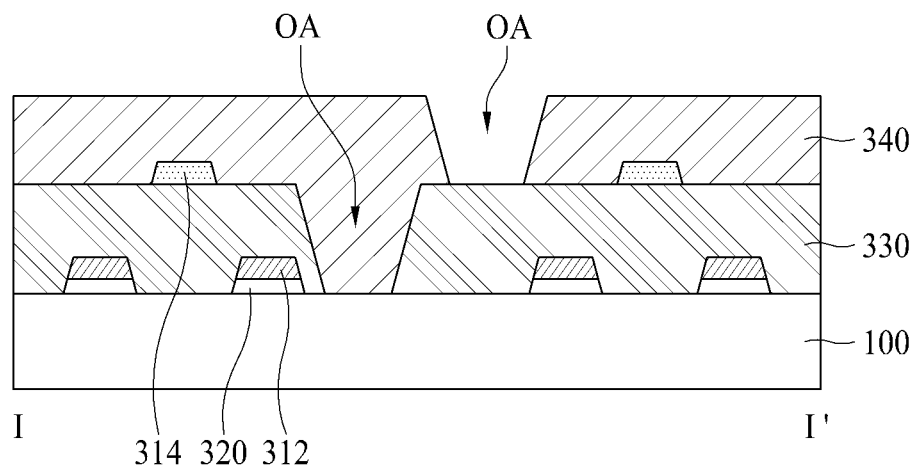
FIG. 7 is a cross-sectional view illustrating a fourth example taken along line I-I' of FIG. 3.
Figure 8:
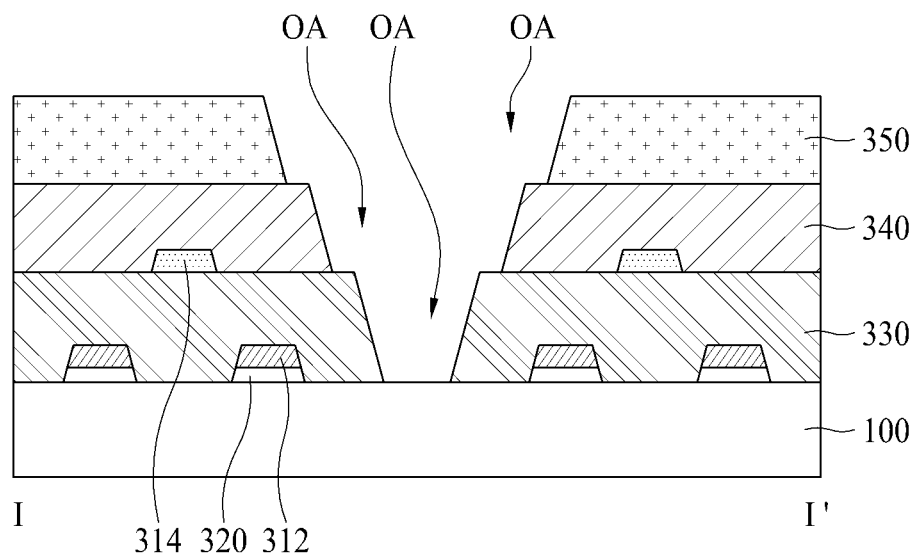
FIG. 8 is a cross-sectional view illustrating a fifth example taken along line I-I' of FIG. 3.

FIG. 3 is a plane view illustrating a first embodiment of a bending area of FIG. 1, FIG. 4 is a cross-sectional view illustrating a first example taken along line I-I' of FIG. 3, FIG. 5 is a cross-sectional view illustrating a second example taken along line I-I' of FIG. 3, FIG. 6 is a cross-sectional view illustrating a third example taken along line I-I' of FIG. 3, FIG. 7 is a cross-sectional view illustrating a fourth example taken along line I-I' of FIG. 3, and FIG. 8 is a cross-sectional view illustrating a fifth example taken along line I-I' of FIG. 3.

Referring to FIGS. 3 to 8, the display panel 10 includes a bending area BA formed in the non-display area and bent. A plurality of lines 310, a first organic film 330, and a second organic film 340 are formed on the bending area BA.

The plurality of lines 310 electrically connect the pixels P arranged in the display area AA with the integrated driver 20 arranged in the non-display area NA. The plurality of lines 310 may include first lines 312 and second lines 314.

Each of the first lines 312 are extended from the pixels P arranged at one end of the display area AA to the integrated driver 20 arranged in the non-display area NA. Each of the first lines 312 may be formed of the same material as that of at least any one of the source electrode 213, the drain electrode 214, the first high potential voltage line 231 and the data line of the display area AA. Also, each of the first lines 312 may be formed by the same process as that of at least any one of the source electrode 213, the drain electrode 214, the first high potential voltage line 231 and the data line of the display area AA. At this time, the first lines 312 may be formed on a layer different from that of the source electrode 213, the drain electrode 214, the first high potential voltage line 231 and the data line of the display area AA. For example, the first lines 312 may be formed on the same layer as that of any one of the gate electrode 212 and the active layer 211 of the display area AA. If the buffer layer 110 is formed in the display area AA, the first lines 312 may be formed on the same layer as that of the material formed on the buffer layer 110 in the display area AA. Referring to FIG. 2, the first lines 312 may be formed on the same layer as that of the active layer 211 in the display area AA. However, the first lines 312 are not limited to the example of FIG. 2, and the first lines 312 may be formed on the same layer as that of the source electrode 213, the drain electrode 214, the first high potential line 231 and the data line. The first lines 312 may be formed of a single layer or multi-layer comprised of any one of Mo, Al, Cr, Au, Ti, Ni, Nd and Cu or their alloy.

The first lines 312 passes the bending area BA formed between the display area AA and the integrated driver 20. The first lines 312 are subjected to a stress in a bending direction during bending. If the first lines 312 arranged in the bending area BA are formed in parallel with the bending direction, it is likely that a crack occurs in the first lines 312 due to the stress. To avoid this, the first lines 312 of the bending area BA may be patterned so as not to be parallel with the bending direction. For example, the first lines 312 of the bending area BA may be formed in a zig zag pattern as shown in FIG. 3. That is, the first lines 312 of the bending area BA may be patterned in an oblique direction with respect to the bending direction. Although each of the first lines 312 is formed in a zig zag pattern to minimize the stress subjected to the first lines 312 of the bending area BA in FIG. 3, the pattern of the first lines 312 is not limited to the zig zag pattern. Each of the first lines 312 may be formed in various patterns, such as a diamond shape, an oval shape, a sine wave pattern, a trapezoid shape, a chain shape, and a honeycomb shape, in addition to a linear pattern parallel with the bending direction.

Each of the second lines 314 are extended from the pixels P arranged at one end of the display area AA to the integrated driver 20 arranged in the non-display area NA. Each of the second lines 314 may be formed of the same material as the material formed on the first planarization film 160 in the display area AA. Referring to FIG. 2, each of the second lines 314 may be formed of the same material as that of at least any one of the anode auxiliary electrode 240 and the second high potential voltage line 232 of the display area AA. Also, each of the second lines 314 may be formed by the same process as that of at least any one of the anode auxiliary node 240 and the second high potential line voltage line 232. The second lines 314 may be formed of a single layer or multi-layer comprised of any one of Mo, Al, Cr, Au, Ti, Ni, Nd and Cu or their alloy.

The second lines 314 passes the bending area BA formed between the display area AA and the integrated driver 20. The second lines 314 are subjected to a stress in a bending direction during bending. If the second lines 314 arranged in the bending area BA are formed in parallel with the bending direction, it is likely that a crack occurs in the second lines 314 due to the stress. To avoid this, the second lines 314 of the bending area BA may be patterned so as not to be parallel with the bending direction. For example, the second lines 314 of the bending area BA may be formed in a zig zag pattern as shown in FIG. 3. That is, the second lines 314 of the bending area BA may be patterned in an oblique direction with respect to the bending direction. Although each of the second lines 314 is formed in a zig zag pattern to minimize the stress subjected to the second lines 314 of the bending area BA in FIG. 3, the pattern of the second lines 314 is not limited to the zig zag pattern. Each of the second lines 314 may be formed in various patterns, such as a diamond shape, an oval shape, a sine wave pattern, a trapezoid shape, a chain shape, and a honeycomb shape, in addition to a linear pattern parallel with the bending direction.

Meanwhile, the second lines 314 may be formed so as not to overlap the first lines 312 as shown in FIG. 3. However, the second lines 314 are not limited to this example. In another embodiment, the second lines 314 may be formed to overlap the first lines 312. In other embodiment, the second lines 314 may be formed in parallel with the first lines 312 by being overlapped with the first lines 312.

The inorganic film 320 is formed between the lower substrate 100 and the first lines 312 in the bending area BA. The inorganic film 320 is arranged below the first lines 312 and protects the first lines 312 from water permeated through the lower substrate 100. The inorganic film 320 may be formed on the same layer as the buffer film 110 of the display area AA by the same process as that of the buffer film 110. Also, the inorganic film 320 may be formed of the same material as that of the buffer film 110. In this case, inorganic film 320 may be formed of a multi-layered film of one or more inorganic films of a silicon oxide film (SiOx), a silicon nitride film (SiNx), SiON and SiO$_2$, which are deposited alternately. Alternatively, the inorganic film 320 may be formed of a single film of one inorganic film of a silicon oxide film (SiOx), a silicon nitride film (SiNx), SiON and $SiO_2$. Since it is likely that a crack occurs in the inorganic film 320, the inorganic film 320 may be patterned along a shape of the first lines 312. Moreover, the bending area BA may be omitted.

The first organic film 330 is formed between the first lines 312 and the second lines 314 in the bending area BA. The first organic film 330 may be arranged on the first lines 312 in the bending area BA and insulate the first lines 312 from the second lines 314. The first organic film 330 may be arranged between the first lines 312 in the bending area BA and insulate the first lines 312 from each other.

The first organic film 330 may be formed by the same process as that of the first planarization film 160 of the display area AA. At this time, the first organic film 330 may be spaced apart from the first planarization film 160 without physical contact with the first planarization film 160. As a result, the crack generated in the first organic film 330 may not be propagated into the first planarization film 160. Also, water permeated into the first organic film 330 may not enter the first planarization film 160.

Also, the first organic film 330 may be formed of the same material as that of the first planarization film 160 of the display area AA. In this case, the first organic film 330 may be formed of an organic film such as acrylic resin, epoxy resin, phenolic resin, polyamide resin, and polyimide resin.

The second organic film 340 is formed on the second lines 314 in the bending area BA. The second organic film 340 may be arranged on the second lines 314 and protects the second lines 314 from an external environment.

The second organic film 340 may be formed by the same process as that of the second planarization film 170 of the display area AA. At this time, the second organic film 340 may be spaced apart from the second planarization film 170 without physical contact with the second planarization film 170. As a result, the crack generated in the second organic film 340 may not be propagated into the second planarization film 170. Also, water permeated into the second organic film 340 may not enter the second planarization film 170.

Hereinafter, technical features of the present disclosure will be described together with various embodiments with reference to FIGS. 4 to 8.

The display panel 10 according to the first embodiment of the present disclosure is technically characterized in that the second organic film 340 arranged in the bending area BA is patterned. In more detail, the second organic film 340 formed in the bending area BA forms an open area between the second lines 314 as shown in FIG. 4 to expose the first organic film 330. At this time, the second lines 314 are not arranged in an area corresponding to the open area of the second organic film 340.

The second organic film 340 may include a plurality of organic film patterns. Even though a crack is generated in the organic film pattern formed on one second line 314, the crack may not be propagated into the organic film pattern formed on another adjacent second line 314. That is, the display panel 10 according to the first embodiment of the present disclosure may prevent a crack from being propagated into another organic film pattern in addition to the corresponding organic film pattern even though the crack is generated in any one of the plurality of organic film patterns included in the second organic film 340. Also, the display panel 10 according to the first embodiment of the present disclosure may minimize the crack generated in the second organic film 340 as a force applied to the second organic film 340 is dispersed by the plurality of organic film patterns during bending.

The display panel 10 according to the second embodiment of the present disclosure is technically characterized in that the second organic film 340 and the first organic film 330 arranged in the bending area BA are patterned. In more detail, the second organic film 340 formed in the bending area BA forms an open area between the second lines 314 as shown in FIG. 5. The first organic film 330 formed in the bending area BA forms an open area between the first lines 312. At this time, the open area of the second lines 314 correspond to the open area of the first lines 330. Therefore, the first and second organic films 330 and 340 expose the lower substrate 100.

Meanwhile, the second lines 314 are not arranged in an area corresponding to the open area of the second organic film 340, and the first lines 312 are not arranged in an area corresponding to the open area of the first organic film 330.

The second organic film 340 may include a plurality of organic film patterns. Even though a crack is generated in the organic film pattern formed on one second line 314, the crack may not be propagated into the organic film pattern formed on another adjacent second line 314. That is, the display panel 10 according to the second embodiment of the present disclosure may prevent a crack from being propagated into another organic film pattern in addition to the corresponding organic film pattern even though the crack is generated in any one of the plurality of organic film patterns included in the second organic film 340. Also, the display panel 10 according to the second embodiment of the present disclosure may minimize the crack generated in the second organic film 340 as a force applied to the second organic film 340 is dispersed by the plurality of organic film patterns during bending.

The first organic film 330 may include a plurality of organic film patterns. Even though a crack is generated in the organic film pattern formed on one first line 312, the crack may not be propagated into the organic film pattern formed on another adjacent first line 312. That is, the display panel 10 according to the second embodiment of the present disclosure may prevent a crack from being propagated into another organic film pattern in addition to the corresponding organic film pattern even though the crack is generated in any one of the plurality of organic film patterns included in the first organic film 330. Also, the display panel 10 according to the second embodiment of the present disclosure may prevent the crack generated in the second organic film 340 from being propagated along the first organic film 330. The display panel 10 according to the second embodiment of the present disclosure may minimize the crack generated in the first organic film 330 as a force applied to the first organic film 330 is dispersed by the plurality of organic film patterns during bending.

Unlike the second embodiment, the display panel 10 according to the second embodiment of the present disclosure is technically characterized in that the first organic film 330 is only patterned. In the display panel 10, the first organic film 330 may only be patterned as shown in FIG. 6 in accordance with a position where a neutral plane is formed in the bending area BA. If it is determined that the crack is generated in the first organic film 330 only in accordance with the position where the neutral plane is formed, the first organic film 330 may only be pattered in the display panel 10. In this case, the neutral plane means a plane that is only bent while maintaining its original length without being increased or decreased when a bending moment is applied thereto. That is, the neutral plane means a plane that a force applied to a bending plane is minimized as a tensile stress and a compression stress, which are applied during bending, are counterbalanced. Thus, if a crack starts in one part of film 330, the OA will prevent further propagation of the crack. In the embodiment of FIG. 6, the OA in film 330 is filled with material from layer 360. This layer will act to buffer the stress and prevent spreading of the crack from one section of film 330 to the other section of film 330. Even if film 340 gets a crack, it will not spread to film 330 since these are different layers of materials. In addition, the film 360 can be made of a different organic material that is slightly more flexible than film 330 and thus less likely to start to crack.

The display panel 10 according to the fourth embodiment of the present disclosure is technically characterized in that the second organic film 340 and the first organic film 330 arranged in the bending area BA are patterned in the same manner as the second embodiment. In more detail, the second organic film 340 formed in the bending area BA forms an open area between the second lines 314 as shown in FIG. 7. The first organic film 330 formed in the bending area BA forms an open area between the first lines 312. In the display panel 10 according to the fourth embodiment of the present disclosure, the open area of the second organic film 340 and the open area of the first organic film 330 do not overlap each other unlike the second embodiment of the present disclosure.

Meanwhile, the second lines 314 are not arranged in an area corresponding to the open area of the second organic film 340, and the first lines 312 are not arranged in an area corresponding to the open area of the first organic film 330. Although the first lines may not be arranged in the area corresponding to the open area of the second organic film 340 as shown in FIG. 7, the first lines are not limited to the example of FIG. 7. In another embodiment, the first lines 312 may be arranged in the area corresponding to the open area of the second organic film 340.

The second organic film 340 may include a plurality of organic film patterns. Even though a crack is generated in the organic film pattern formed on one second line 314, the crack may not be propagated into the organic film pattern formed on another adjacent second line 314. That is, the display panel 10 according to the fourth embodiment of the present disclosure may prevent a crack from being propagated into another organic film pattern in addition to the corresponding organic film pattern even though the crack is generated in any one of the plurality of organic film patterns included in the second organic film 340. Also, the display panel 10 according to the fourth embodiment of the present disclosure may minimize the crack generated in the second organic film 340 as a force applied to the second organic film 340 is dispersed by the plurality of organic film patterns during bending.

The first organic film 330 may include a plurality of organic film patterns. Even though a crack is generated in the organic film pattern formed on one first line 312, the crack may not be propagated into the organic film pattern formed on another adjacent first line 312. That is, the display panel 10 according to the fourth embodiment of the present disclosure may prevent a crack from being propagated into another organic film pattern in addition to the corresponding organic film pattern even though the crack is generated in any one of the plurality of organic film patterns included in the first organic film 330. Also, the display panel 10 according to the fourth embodiment of the present disclosure may prevent the crack generated in the second organic film 340 from being propagated along the first organic film 330. The display panel 10 according to the fourth embodiment of the present disclosure may minimize the crack generated in the first organic film 330 as a force applied to the first organic film 330 is dispersed by the plurality of organic film patterns during bending.

Although the aforementioned display panel 10 according to the first to fourth embodiments includes the first and second organic films 330 and 340 in the bending area BA, the present disclosure is not limited to the first to fourth embodiments.

The display panel 10 according to the fifth embodiment of the present disclosure may further include a third organic film 350 and is technically characterized in that the first to third organic film 330, 340 and 350 are patterned.

In more detail, the display panel 10 according to the fifth embodiment of the present disclosure may further include the third organic film 350 formed on the second organic film 340 in the bending area BA. The third organic film 350 may be formed by the same process as that of at least any one of the bank 180 and the spacer 181 of the display area AA. At this time, the third organic film 350 may be spaced apart from any one of the bank 180 and the spacer 181 without physical contact with any one of the bank 180 and the spacer 181. As a result, the crack generated in the third organic film 350 may not be propagated into any one of the bank 180 and the spacer 181. Also, water permeated into the third organic film 350 may not enter the bank 180 and the spacer 181.

Also, the third organic film 350 may be formed of the same material as that of any one of the bank 180 and the spacer 181 of the display area AA. In this case, the third organic film 350 may be formed of an organic film such as acrylic resin, epoxy resin, phenolic resin, polyamide resin, and polyimide resin.

The third organic film 350 formed in the bending area BA forms an open area as shown in FIG. 8. The second organic film 340 formed in the bending area BA forms an open area between the second lines 314 as shown in FIG. 8. The first organic film 330 formed in the bending area BA forms an open area between the first lines 312. At this time, the open area of the third organic film 350, the open area of the second organic film 340 and the open area of the first organic film 330 correspond to one another. Therefore, the first, second and third organic films 330, 340 and 350 expose the lower substrate 100.

Meanwhile, the second lines 314 are not arranged in an area corresponding to the open area of the second organic film 340, and the first lines 312 are not arranged in an area corresponding to the open area of the first organic film 330.

The second organic film 340 may include a plurality of organic film patterns. Even though a crack is generated in the organic film pattern formed on one second line 314, the crack may not be propagated into the organic film pattern formed on another adjacent second line 314. That is, the display panel 10 according to the fifth embodiment of the present disclosure may prevent a crack from being propagated into another organic film pattern in addition to the corresponding organic film pattern even though the crack is generated in any one of the plurality of organic film patterns included in the second organic film 340. Also, the display panel 10 according to the fifth embodiment of the present disclosure may minimize the crack generated in the second organic film 340 as a force applied to the second organic film 340 is dispersed by the plurality of organic film patterns during bending.

The first organic film 330 may include a plurality of organic film patterns. Even though a crack is generated in the organic film pattern formed on one first line 312, the crack may not be propagated into the organic film pattern formed on another adjacent first line 312. That is, the display panel 10 according to the fifth embodiment of the present disclosure may prevent a crack from being propagated into another organic film pattern in addition to the corresponding organic film pattern even though the crack is generated in any one of the plurality of organic film patterns included in the first organic film 330. Also, the display panel 10 according to the fifth embodiment of the present disclosure may prevent the crack generated in the second organic film 340 from being propagated along the first organic film 330. The display panel 10 according to the fifth embodiment of the present disclosure may minimize the crack generated in the first organic film 330 as a force applied to the first organic film 330 is dispersed by the plurality of organic film patterns during bending.

The third organic film 350 may include a plurality of organic film patterns. Even though a crack is generated in one organic film pattern of the third organic film 350, the crack may not be propagated into another adjacent organic film pattern. That is, the display panel 10 according to the fifth embodiment of the present disclosure may prevent a crack from being propagated into another organic film pattern in addition to the corresponding organic film pattern even though the crack is generated in any one of the plurality of organic film patterns included in the third organic film 350. Also, the display panel 10 according to the fifth embodiment of the present disclosure may minimize the crack generated in the third organic film 350 as a force applied to the third organic film 350 is dispersed by the plurality of organic film patterns during bending.

The plurality of lines 310 according to the first to fifth embodiments respectively have, but not limited to, an independent structure. Hereinafter, an embodiment that the plurality of lines 312 are connected with one another will be described with reference to FIGS. 9 to 10.

Figure 9:
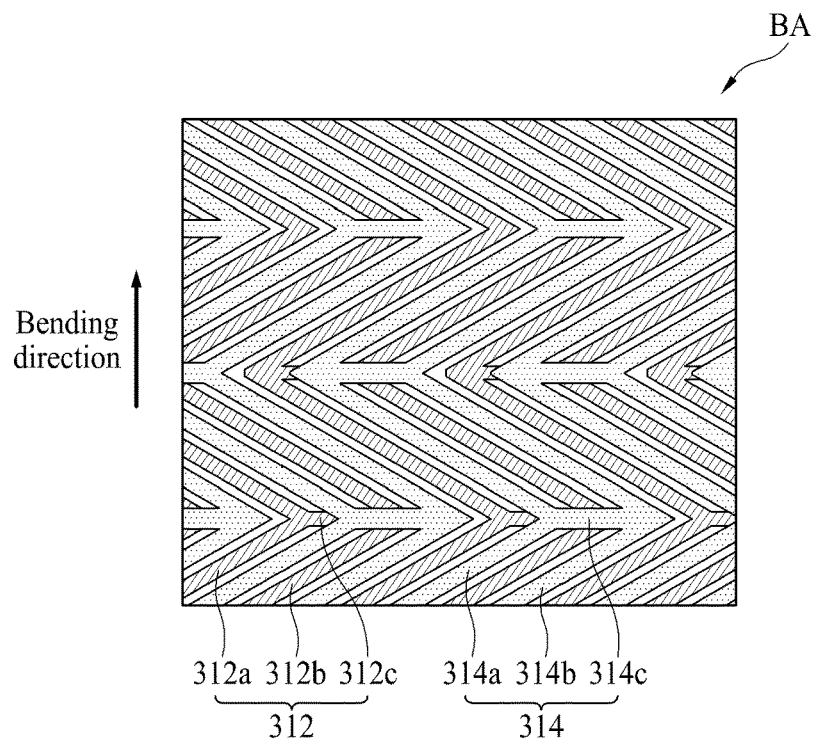
FIG. 9 is a plane view illustrating a second embodiment of a bending area of FIG. 1.
Figure 10:
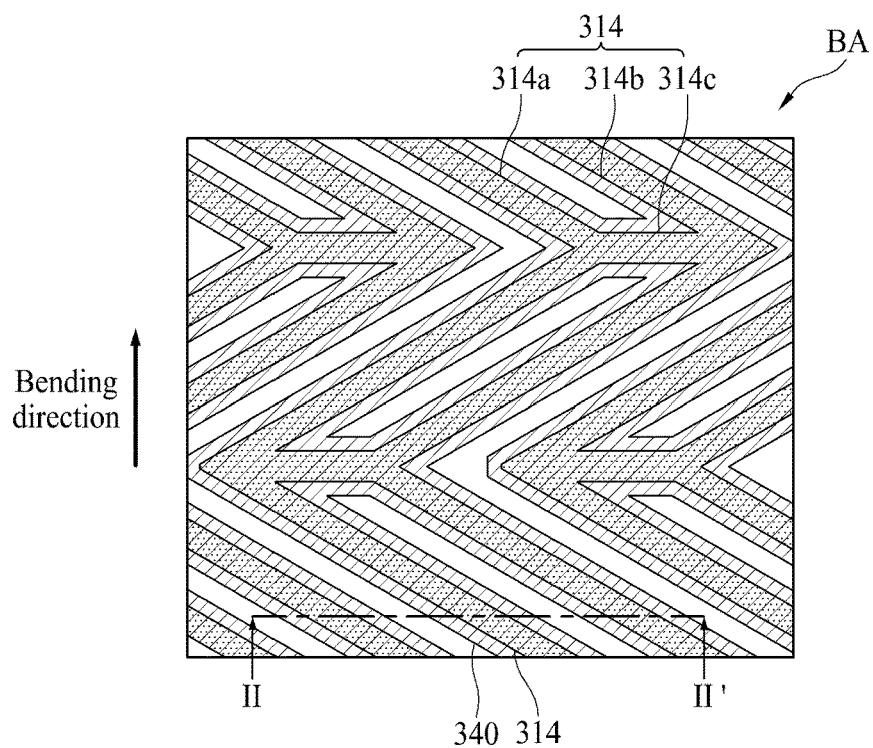
FIG. 10 is a plane view illustrating an area for forming a second organic film and a second line.
Figure 11:
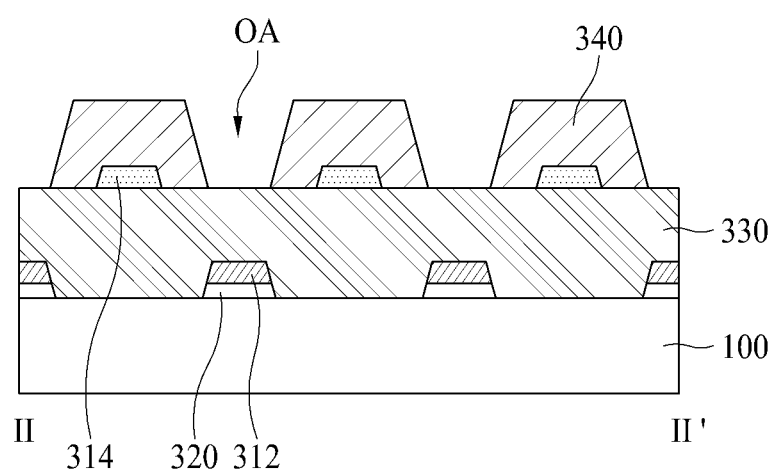
FIG. 11 is a cross-sectional view illustrating an example taken along line II-II' of FIG. 9.

FIG. 9 is a plane view illustrating a second embodiment of a bending area of FIG. 1, FIG. 10 is a plane view illustrating an area for forming a second organic film and a second line, and FIG. 11 is a cross-sectional view illustrating an example taken along line II-II' of FIG. 9.

The bending area BA shown in FIGS. 9 to 11 is different from the bending area BA shown in FIGS. 3 to 8 in that the plurality of lines 310 are connected with one another. Hereinafter, the bending area BA shown in FIGS. 9 to 11 will be described based on the difference from the bending area shown in FIGS. 3 to 8, and its repeated description will be omitted.

Referring to FIG. 9 to 11, the display panel 10 includes the bending area BA bent in the non-display area, wherein the plurality of lines 310, the first organic film 330 and the second organic film 340 are formed in the bending area BA.

The plurality of lines 310 electrically connect the pixels P arranged in the display area AA with the integrated driver 20 arranged in the non-display area NA. The plurality of lines 310 may include the first lines 312 and the second lines 314.

The first lines 312 may have a structure that two or more adjacent first lines are connected with each other. For example, the first lines 312 may have a structure that two first lines 312 arranged to adjoin each other are connected with each other as shown in FIG. 9. In more detail, the first lines 312 may include a first extension line 312a, a second extension line 312b formed to adjoin the first extension line 312a in parallel with the first extension line 312a, and a first connection line 312c connecting the first extension line 312a with the second extension line 312c. The first connection line 312c may be extended from one side of the first extension line 312a to one side of the second extension line 312b adjacent to the first extension line 312a. Therefore, two first and second extension lines 312a and 312b may electrically be connected with each other through the first connection line 312c. In the present disclosure, since the first extension line 312a and the second extension line 312b are connected with each other by the first connection line 312c, even though a crack is generated in one of the two lines, signal transfer may be performed normally through another line.

The second lines 314 may have a structure that two or more adjacent second lines are connected with each other. For example, the second lines 314 may have a structure that two second lines 314 arranged to adjoin each other are connected with each other as shown in FIG. 9. In more detail, the second lines 314 may include a first extension line 314a, a second extension line 314b formed to adjoin the first extension line 314a in parallel with the first extension line 314a, and a second connection line 314c connecting the first extension line 314a with the second extension line 314c. The second connection line 314c may be extended from one side of the first extension line 314a to one side of the second extension line 314b adjacent to the first extension line 314a. Therefore, two first and second extension lines 314a and 314b may electrically be connected with each other through the second connection line 314c. In the present disclosure, since the first extension line 314a and the second extension line 314b are connected with each other by the second connection line 314c, even though a crack is generated in one of the two lines, signal transfer may be performed normally through another line.

The first organic film 330 is formed between the first lines 312 and the second lines 314 in the bending area BA. The second organic film 340 is formed on the second lines 314 in the bending area BA and protects the second lines 314 from an external environment.

The second organic film 340 is arranged in the bending area BA and patterned. The second organic film 340 may expose the first organic film 330 by forming an open area between the second lines 314. Moreover, the second organic film 340 may form an open area between the first extension line 314a and the second extension line 314b connected with each other by the second connection line 314c. Even though the open area is formed between the first extension line 314a and the second extension line 314b connected with each other by the second connection line 314c, the second organic film 340 does not expose the second connection line 314c by opening an area where the second connection line 314c is formed.

At this time, the second lines 314 are not formed in the area corresponding to the open area of the second organic film 340. Meanwhile, although the first lines 312 may not be formed in the area corresponding to the open area of the second organic film 340 as shown in FIG. 11, the first lines 312 are not limited to the example of FIG. 11. In another embodiment, the first lines 312 may be formed in the area corresponding to the open area of the second organic film 340.

As described above, the display device according to the present disclosure has advantages as follows.

According to the present disclosure, the organic film arranged in the bending area may be patterned to prevent the crack generated in the organic film from being propagated.

Also, according to the present disclosure, as the open area may be formed in the organic film to have a plurality of patterns, the force applied to the organic film may be dispersed by the plurality of patterns, whereby the crack generated in the organic film may be minimized.

Also, according to the present disclosure, the plurality of lines arranged in the bending area are patterned so as not to be parallel with the bending direction, whereby the stress subjected to the plurality of lines during bending may be minimized. Therefore, occurrence of the crack in the plurality of lines may be minimized.

Also, according to the present disclosure, the plurality of lines arranged in the bending area are formed as a dual layer by interposing the organic films therebetween, whereby the area for forming the lines may be increased. Therefore, the present disclosure may increase the number of lines that may be arranged in the bending area, and may be applied to the display device of high resolution.

Also, the first and second lines formed in the bending area may be formed by the same process as that of at least one of the source electrode, the drain electrode and the anode auxiliary electrode of the display area, whereby the lines may be formed in the dual layer without additional separate process.

Also, the organic films formed in the bending area may be formed by the same process as that of at least one of the first planarization film, the second planarization film, the bank and the spacer of the display area, whereby two or more organic films may be formed without additional separate process.

Also, the organic films formed in the bending area may be spaced apart from the organic films of the display area, whereby the crack generated in the organic films formed in the bending area may be prevented from being propagated into the display area. Also, water permeated into the organic films formed in the bending area may be prevented from entering the display area.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. Thus, the above embodiments are to be considered in all respects as illustrative and not restrictive. The scope of the disclosure should be determined by reasonable interpretation of the appended claims and all change which comes within the equivalent scope of the disclosure are included in the scope of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
    a display area in which pixels are arranged, and a non-display area surrounding the display area;
    a bending area within the non-display area;
    a plurality of first lines arranged in the bending area and electrically connected with the pixels;
    a first organic film arranged on the first lines;
    a plurality of second lines arranged on the first organic film in the bending area and electrically connected with the pixels;
    a second organic film arranged on the second lines; and
    an open area located within at least one of the first organic film and the second organic film;
    wherein each of the pixels includes:
        a thin film transistor including an active layer, a gate electrode, a source electrode and a drain electrode;
        an anode auxiliary electrode connected to the source electrode or the drain electrode of the thin film transistor;
        an anode electrode connected to the anode auxiliary electrode;
        a first planarization film arranged on the source electrode and the drain electrode; and
        a second planarization film arranged on the anode auxiliary electrode;
    wherein the second organic film is made of the same material as that of the second planarization film and spaced apart from the second planarization film.

2. The display device of claim 1, wherein the second organic film is provided with an open area formed between the second lines.

3. The display device of claim 1, wherein the first organic film is provided with an open area formed between the first lines.

4. The display device of claim 1, wherein
    the plurality of first lines are made of the same material as that of the source electrode and the drain electrode of the thin film transistor.

5. The display device of claim 1,
    wherein the plurality of second lines are made of the same material as that of the anode auxiliary electrode.

6. The display device of claim 1, wherein
    the first organic film is made of the same material as that of the first planarization film and spaced apart from the first planarization film.

7. The display device of claim 5, further comprising a third organic film arranged on the second organic film and provided with an open area.

8. The display device of claim 7, wherein each of the pixels further includes:
    a bank arranged on the anode electrode, and
    the third organic film is made of the same material as that of the bank and spaced apart from the first planarization film.

9. The display device of claim 1, wherein the first organic film is provided with an open area formed between the plurality of first lines, and the second organic film is provided with an open area formed between the plurality of second lines, and the open area of the first organic film and the open area of the second organic film are not overlapped with each other.

10. The display device of claim 1, further comprising an inorganic film arranged between a substrate and the plurality of first lines.

11. The display device of claim 10, wherein the inorganic film is patterned along a shape of the first lines.

12. The display device of claim 1, wherein the plurality of second lines are provided such that two or more adjacent lines are connected with each other.

13. The display device of claim 12, wherein the second organic film is provided with an open area formed between the second lines which are not directly connected with each other.

14. The display device of claim 13, wherein the second organic film is provided with an open area formed between the second lines which are connected with each other.

* * * * *